(12) United States Patent
Kozodoy et al.

(10) Patent No.: US 6,265,727 B1
(45) Date of Patent: Jul. 24, 2001

(54) SOLAR BLIND PHOTODIODE HAVING AN ACTIVE REGION WITH A LARGER BANDGAP THAN ONE OR BOTH IF ITS SURROUNDING DOPED REGIONS

(75) Inventors: Peter Kozodoy, Santa Barbara; Eric J. Tarsa, Goleta, both of CA (US)

(73) Assignee: Cree Lighting Company, Goleta, CA (US)

( * ) Notice: Subject to any disclaimer, the term of this patent is extended or adjusted under 35 U.S.C. 154(b) by 0 days.

(21) Appl. No.: 09/328,555

(22) Filed: Jun. 9, 1999

(51) Int. Cl.[7] .......................... H01L 29/06; H01L 31/072; H01L 31/075
(52) U.S. Cl. ......................... 257/21; 257/184; 257/438; 257/458; 257/460
(58) Field of Search .................................. 257/12, 14, 21, 257/22, 184, 186, 438, 458, 460

(56) References Cited

U.S. PATENT DOCUMENTS 5,789,465 * 8/1998 Nishikata et al. ............... 257/103

OTHER PUBLICATIONS

Brown, et al., "Silicon Carbide UV Photodiodes", *IEEE Transactions on Electron Devices*, vol. 40, No. 2, pp. 325–331, (Feb. 1993).

Carrano, et al., "Very Low Dark Current Metal–Semiconductor–Metal Ultraviolet Photodetectors Fabricated On Single–Crystal GaN Epitaxial Layers", *American Institute of Physics*, Appl. Phys. Lett. 70(15), pp. 1992–1994, (Apr. 14, 1997).

Chen, et al., "Schottky Barrier Detectors On GaN For Visible–Blind Ultraviolet Detection", *American Institute of Physics*, Appl. Phys. Lett. 70(17), pp. 2277–2279, (Apr. 28, 1997).

Khan, et al., "High–Responsvity Photoconductive Ultraviolet Sensors Based On Insulating Single–Crystal GaN Epilayers", *American Institute of Physics*, Appl. Phys. Lett. 60(23), pp. 2917–2919,Jun. 8, 1992.

Lim, et al., "8×8 GaN Schottky Barrier Photodiode Array For Visible–Blind Imaging", *Electronics Letters*, vol. 33, No. 7, pp. 633–634, (Mar. 27, 1997).

Lim, et al., "High Responsitivity Intrinsic Photoconducts Based on $Al_xGa_{1-x}N$", *American Institute of Physics*, Appl. Phys. Lett. 68(26), pp. 3761–3762, (Jun. 24, 1996).

Walker, et al., "AIGaN Ultraviolet Photoconductors Grown On Sapphire", *American Institute of Physics*, Appl. Phys. Lett. 68(15), pp. 2100–2101, (Apr. 8, 1996).

Xu, et al., "High Speed, Low Noise Ultraviolet Photodetectors Based on GaN p–i–n and AIGaN(p)–GaN(i)–GaN(n) Structures", *American Institute of Physics*, Appl. Phys. Lett. 71(15), pp. 2154–2156, (Oct. 13, 1997).

\* cited by examiner

*Primary Examiner*—Minh Loan Tran
(74) *Attorney, Agent, or Firm*—Koppel & Jacobs

(57) ABSTRACT

A solar blind p-i-n photodiode where the active i-region has a bandgap larger than the bandgap of one or both of the n-type and p-type regions. The preferred embodiment photodiode is GaN based and Al is added to the regions to obtain the desired bandgap profiles. Al is added to the i-region to obtain a bandgap large enough to be responsive to light in the solar blind spectrum. By having a smaller bandgap p-type and n-type region, the problems associated with growing highly doped AlGaN are avoided. In most embodiments the light incident on the photodiode illuminates the p-type region first. The p-type region is grown thin compared to conventional photodiodes which allows the majority of light incident to pass through the p-type region to the i-region. Light with sufficient energy will be detected in the i-region. The inventive photodiode can also be used in the fabrication of backside illuminated solar blind photodiodes that are useful for photodiode arrays. The inventive photodiode can also be used in avalanche mode by applying a large reverse bias across the p-type and n-type regions.

63 Claims, 4 Drawing Sheets

SOLAR BLIND PHOTODIODE HAVING AN ACTIVE REGION WITH A LARGER BANDGAP THAN ONE OR BOTH IF ITS SURROUNDING DOPED REGIONS

BACKGROUND OF THE INVENTION

1. Field of the Invention

This invention relates to photodiodes and more particularly to a p-i-n junction photodiode reactive to the visible blind and true solar blind spectral regions.

2. Description of the Related Art

Solid state photoconductors and photodiodes constitute an important class of photodetectors which convert electromagnetic energy directly into electric energy via the photoconductivity effect that occurs in semiconductors. Recent improvements in semiconductor material quality has focused development on photoconductors and photodiodes with peak sensitivity in the visible blind and true solar blind spectral regions. True solar blind detection requires sensitivity to wavelengths below approximately 300 nm, while visible blind detection requires sensitivity to wavelengths below approximately 400 nm. The development of true solar blind detectors has proven particularly important. It is known that the earth's ozone layer filters out light with a wavelength below approximately 300 nm. If a true solar blind detector can be developed, light sources below the earths atmosphere (such as missile plumes) can be detected while rejecting solar background interference. This technology has many other applications, such as detection in a biological absorption spectrum, detection of non-visible hydrogen flames and satellite communication.

Various visible blind photoconductors have been successfully developed with high intrinsic gain and low leakage currents. [M. A. Khan, et.al., High-responsivity Photoconductive Ultraviolet Sensors Based on Insulating Single-Crystal GaN Epilayers, Appl.Phys.Lett.60 (23), Jun. 8, 1992, Pages 2917–2019; J. C. Carrano, et.al., Very Low Dark Current Metal-Semiconductor-Metal Photodetectors Fabricated on Single-Crystal GaN Epitaxial Layers, Appl.Phys.Lett.70 (15), Apr. 14, 1997, Pages 1992–1994]. Visible blind photodiodes have also been developed using GaN as the active device layer resulting in a wavelength detection cutoff of approximately 365 nm. Visible-blind Schottky barrier photodiodes have been demonstrated with responsiveness as high as 0.18 Amps/Watt (A/W) and response time of 118 nanoseconds (ns) [Q.Chen et.al., Schottky Barrier Detectors on GaN for Visible-Blind Ultraviolet Detection, Appl.Phys.Lett.70 (17), Apr. 28, 1997, Pages 2277–2279]. Visible blind Schottky photodiode arrays with 8×8 pixels have also been demonstrated, with somewhat poorer characteristics, having responsiveness of 0.05 A/W with a response time of 50 ns. [B. W. Lim et.al., 8×8 GaN Schottky Barrier Photodiode Array for Visible Blind Imaging, Electronics Letters, Vol.33 No.7, 1997, Page 633]. Visible blind p-i-n photodiodes have also been developed with responsiveness as high as 0.12 A/W and response times of 12 ns. [G. Y. Xu, et.al., High Speed, Low Noise Ultraviolet Photodetectors Based on GaN p-i-n and AlGaN (p)-GaN(i)-GaN(n) Structures, Appl.Phys.Lett.71 (15), Oct. 13, 1997, Pages 2154–2156]. Silicon carbide (SiC) visible blind photodiodes have been developed having high responsivity and low dark current. [D. M. Brown et. al., Silicon Carbide UV Photodiodes, IEEE Trans. On Electr. Devices, Vol.40 No.2, Feb. 1993, Pages 325–331]. Si photodiodes cannot be made intrinsically visible blind without the use of external filters due to the electronic band structure of silicon.

The development of true solar blind photodetectors has proven more difficult. Attempts have been made to modify Si photodiodes to make them true solar blind photodiodes. However, this modification requires the addition of external filters to the photodiodes. These filters are complex, expensive, fragile and typically allow only approximately 50% transmission of the light source to the device. True solar blind photoconductors without external filters have also been developed [D. Walker et.al., AlGaN Ultraviolet Photoconductors Grown on Sapphire, Appl.Phys.Lett.68 (15), Apr. 8, 1996, Pages 2100–2101; B. W. Lim, et.al., High Responsivity Intrinsic Photoconductors Based on $Al_xGa_{1-x}N$, Appl.Phys.Lett.68 (26), Jun. 24, 1996, Pages 3761–3762], but these devices suffer consistently slow response times and degraded performance compared to visible blind photoconductors.

Efforts have been made, largely unsuccessfully, to develop true solar blind nitride based p-i-n photodiode It is well known that, as the wavelength of light decreases, the energy increases. To be solar blind, the bandgap in the active i-region of the photodiode must be large enough to be responsive to the energy contained in an approximately 300 nm wavelength light source, while rejecting longer wavelength light. The addition of aluminum (Al) to a nitride based semiconductor material will increase the bandgap of the material. The greater the percentage of Al, the larger the bandgap. For the active i-region to have a large enough bandgap to be responsive to wavelengths lower than 300 nm, a relatively high percentage of Al must be added.

In most p-i-n photodiodes, the light incident on the device illuminates the p-type region first. The light to be detected in the active i-region must be able to first pass through the p-type region. However, conventional p-i-n photodiodes are homojunction, having the same bandgap for all regions. If the p-type region has the same bandgap as the i-region, the light to be detected in the i-region will excite carriers in the p-type region and will be absorbed, so it cannot pass to the i-region for detection. A p-type region with the same bandgap as the i-region effectively blocks light from passing to the i-region. This problem becomes worse when Al is added to the i-region to enlarge its bandgap energy.

A proposed solution to this problem was to increase the bandgap in the p-type region to an energy level greater than the bandgap of the i-region (heterostructure) so that the wavelength of light to be detected by the active i-region will not have sufficient energy to excite the higher bandgap p-type region. The goal is to have the light pass through the p-type region without being absorbed so that is can be detected in the i-region. To obtain a higher bandgap, the p-type region must have a greater percentage of Al than the i-region.

However, published research indicates that high Al-content AlGaN alloys present major challenges in terms of growth, lattice mismatch strain, and doping, particularly for p-type AlGaN [M. Suzuki, et.al., Doping Characteristics and Electrical properties of Mg-doped AlGaN Grown by Atmospheric-Pressure MOCVD, $2^{nd}$ ICNS, Oct. 27–31 1997, Pages 464–465]. During the growth of a high Al content p-type GaN diode, lattice mismatch will result in tensile strain at the junctions and eventual cracking. High Al content n-type GaN with good structural integrity has been grown with greater success than high Al content p-type GaN.

In addition, high Al content AlGaN can lead to significantly increased response times and reduced responsiveness in photoconductors [Q.Chen et.al., Schottky Barrier Detectors on GaN for Visible-Blind Ultraviolet Detection, Appl- .Phys.Lett.70 (17), Apr. 28, 1997, Pages 2277–2279, and references therein]. Photodiodes with high Al content p and n-type regions will likely experience the same increased response time and reduced responsiveness.

SUMMARY OF THE INVENTION

The present invention is a novel photodiode that can be tailored to detect different wavelengths of light but is particularly useful in detecting in the solar blind spectral region. The photodiode employs an inverted heterostructure p-i-n design where one or both of the p and n-type regions have a smaller bandgap than the active i-region. The smaller bandgap region which receives the light incident on the structure, is grown thin enough to allow the majority of light energy to pass through to the active i-region for detection. The present invention is a truly solar blind photodiode that operates without external filters.

The new photodiode structure circumvents a number of materials and design related problems associated with the fabrication of short wavelength photodetectors. By having one or both of the p and n-type regions of smaller bandgap than the i-region, the invention allows for the fabrication of true solar-blind photodiodes while minimizing the need for highly-doped, wide bandgap p or n-type regions. The invention avoids the growth and doping problems, lattice mismatch strain, and degraded performance associated with highly doped, wide bandgap semiconductor material.

To achieve true solar blind detection, the new photodiode can be fabricated using group III nitride alloys including, but not limited to, GaN, AlGaN, InGaN, and AlInGaN, with the specific composition of the constituent layers selected so as to achieve the desired bandgaps of the various regions. However, other semiconductor and doping materials can be used in different combinations and proportions to create photodiodes responsive to different wavelengths. An example of the new p-i-n photodiode structure is GaN-based with Al or Al and In added to the intrinsic or lightly doped GaN active i-region in amounts that make the region responsive to wavelengths less than approximately 300 nm, with the surrounding p and n-type regions having bandgaps at least 10% smaller than that of the i-region. The light incident region (usually the p-type region) is grown thin enough that the majority of light passes through to the active i-region.

The difference in bandgaps between the i-region and the surrounding p and n-type regions also results in band offsets at the respective heterojunctions. The band offset enhances wavelength cutoff and the response time by preventing carriers generated in the p and n-type regions from diffusing into the active i-region and contributing to the photocurrent. The wavelength cutoff and time response of the photodiode is further enhanced by placing quantum wells in the narrower bandgap p and/or n-type regions near or at the heterojunctions. Quantum wells or thin layers of reduced bandgap may be included to promote the recombination of unwanted photoexcited carriers generated in the p and or n-type regions before they can reach the active (wider bandgap) i-region. The number of quantum wells may vary from one to greater than 10, and the wells may be closely spaced so as to produce a superlattice sufficiently wide such that confinement effects are avoided. The new photodiode structure may also be used for back-side illuminated photodiode and avalanche mode photodiodes.

These and other further features and advantages of the invention will be apparent to those skilled in the art from the following detailed description, taken together with the accompanying drawings, in which:

DETAILED DESCRIPTION OF THE INVENTION

Figure 1:
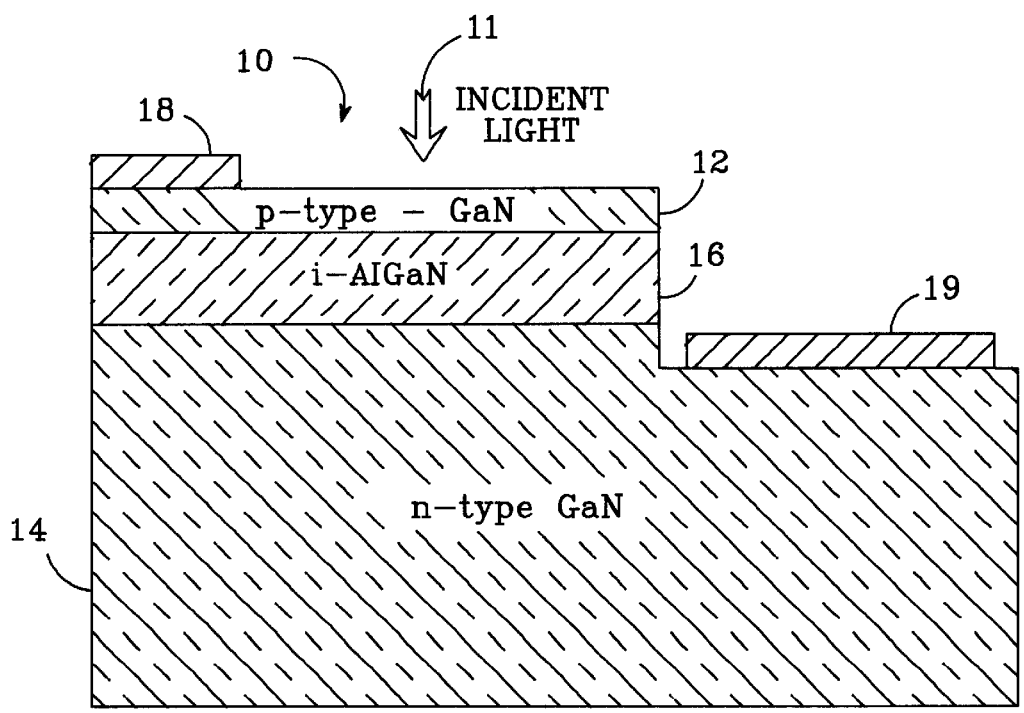
FIG. 1 is a sectional view of one embodiment for the new inverted heterostructure photodiode.

FIG. 1 shows an embodiment of the new photodiode 10 which is responsive to wavelengths of light in the true solar blind spectral region. It is a p-i-n photodiode having an active intrinsic or lightly doped active region (i-region) 16, a p-type region 12 on one side of the i-region 16 and n-type region 14, on the opposite side of the i-region 16, the i-region 16 having a larger bandgap than the surrounding p-type 12 and n-type 14 regions. In the preferred embodiment, the i-region is AlGaN and the p-type and n-type regions are GaN. However, the p-type, i, and n-type regions may be composed of binary, ternary or quaternary alloys ($Al_xIn_yGa_{1-x-y}N$ such that $0 \leq x \leq 1$, $0 \leq y \leq 1$, $x+y \leq 1$) provided that one or both of their p and n-type region bandgaps remain smaller that the i-region bandgap.

In the preferred embodiment, the incident light 11 illuminates the p-region 12 first. However, the photodiode 10 will function similarly if the incident light 11 illuminates the n-type region 14 first. The photodiode 10 can also have only one of the p-type 12 and n-type 14 regions with a bandgap smaller than the i-region 16. For instance, when the incident light 11 illuminates the p-region 12 first, the p-region can be smaller bandgap than the i-region 16 and the n-region 14 can have a larger bandgap than the i-region 16. This structure will also function as a solar blind photodiode while still avoiding the difficulties in growing high Al content p-type AlGaN. However, in the preferred photodiode both the p an n-type regions are smaller bandgap to better enhance the response time and wavelength cuttoff of the photodiode.

To be true solar blind, the i-region 16 must have a wide enough bandgap to be reactive to light energy with a wavelength less than approximately 300 nm. Longer wavelength light will not have sufficient energy to excite carriers in the i region 16, thereby being rejected by the photodiode. It is known that the addition of Al to GaN will increase the bandgap of GaN. In the preferred photodiode 10, the i-region 16 is grown with approximately 30% Al, to provide a bandgap that is solar blind responsive. However, indium (In) may be added as well as Al to modify the lattice constant of the active i-region, thereby allowing improved lattice matching between the active layer and the adjacent layers. The adjacent p-type 12 and n-type regions 14 have a bandgap that is at least 10% smaller than the active i-region 16.

The three regions of the photodiode can vary in thickness between 10 angstroms and tens of microns. However, the p-type region 12 is typically 10 angstroms to 1 micron thick, the i-region 16 is typically 50 angstroms to 5 microns thick and the n-type region 14 is typically 50 angstroms to 5 microns thick. In the preferred embodiment the p-type layer is grown to approximately 300 angstroms.

Electrical contacts 18 and 19 are deposited at the p-type and n-type regions using known metalization processes. In operation, the photodiode 10 will be illuminated and the light energy will pass to the i-region 16. In the i-region 16, electron-hole pairs are created and drawn in separate directions because of the electric field across the i-region 16. The contacts 18,19 allow the electrons and holes to flow out of the device, forming a current. The contacts 18,19 can also be used to apply a bias to the photodiode 10 for operation in biased mode or avalanche mode. Electrical contact 18 does not cover the entire surface of the p-type region 12, allowing incident light 11 on the structure to illuminate the uncovered surface of the p-type region 12. However, a thin contact (e.g. <100 angstroms) may be applied to the surface of the p-type region in combination with the contact 18 to enhance current flow and collection from this region, provided the thin contact does not significantly obstruct the transmission of light into the device.

While a specific device is shown which functions as a true solar blind photodiode, it could be modified in various ways to detect different wavelengths without departing from the invention. The layer thickness, layer composition and number of layers could change. The invention could be based on any of the group III nitrides such as (Al,In,Ga)N. For instance, adding In to GaN lowers the bandgap of GaN. A photodiode device using GaN as the active i-region surrounded by InGaN p and n-type regions would result in a device having an active region with a larger bandgap than the surrounding contact/cladding layers. Further, a variety of combinations (binary, ternary, quaternary, etc) of group III nitrides could be used to provide the inventive bandgap profile.

The invention may also be produced using various combinations of material systems such as (Al,In,Ga)As or (Hg,Cd)Te, in combination to achieve the desired bandgap profile. For instance, the invention could be constructed with a GaAs active region surrounded by InGaAs p and n-type regions. Materials systems using (Al,In,Ga)P, as well as any other periodic table Group III-V or Group II-VI materials are also suitable for this invention. Accordingly, the photodiode device shown, as well as the additional illustrations, are not intended to limit the invention to any particular structure or composition.

Figure 2:
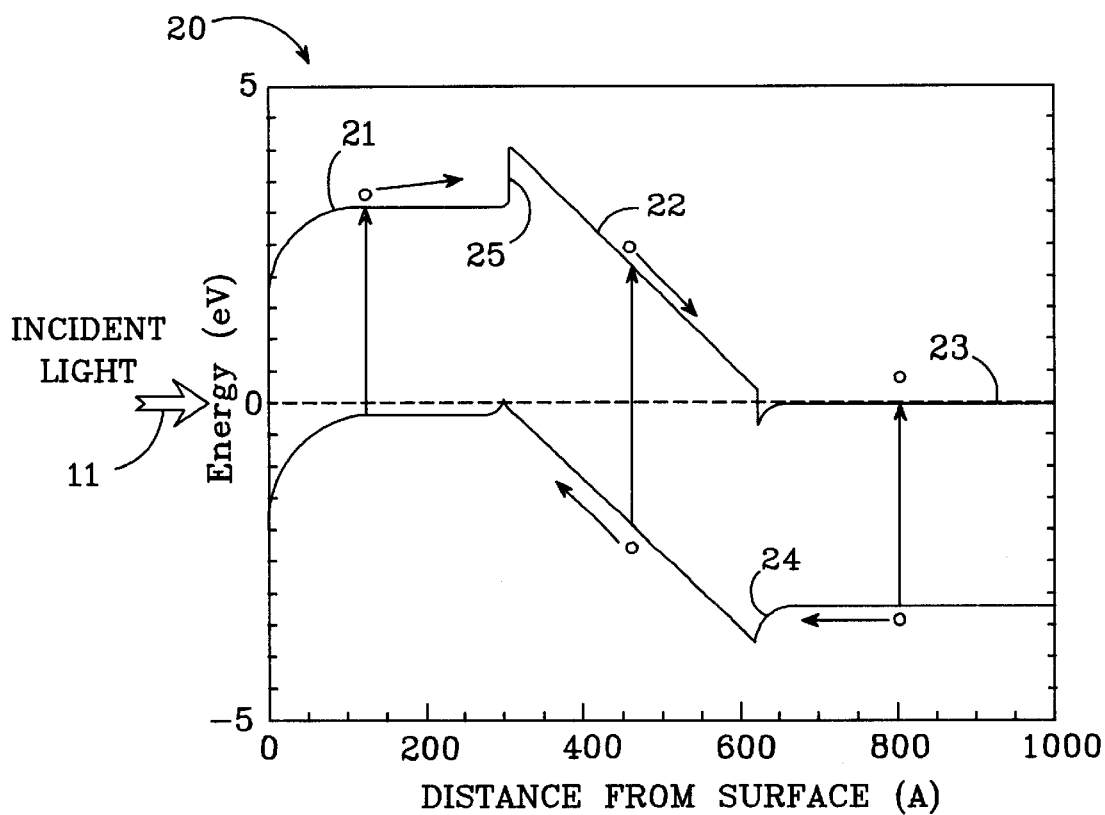
FIG. 2 is a representative band diagram for the photodiode shown in FIG. 1.

FIG. 2 is the band diagram 20 for the photodiode 10 showing the bandgaps for the p-type region 21, i-region 22 and n-type region 23. Light incident 11 on the device illuminates the p-type region first. Because the p-type region bandgap 21 is smaller than the i-region bandgap 22, the energy necessary to excite carriers in the i-region 16 will also excite carriers in the p-type region 12. It would be expected that this energy would be absorbed by the smaller bandgap p-type region 21 and not transmit to the i-region 16. However, in new photodiode, the smaller bandgap p-type region is grown thin (to approximately 300 angstroms) resulting in only a small percentage of the light incident on the structure exciting carriers in the p-type region 12. The majority of light will pass to the i-region 16 and light having an energy greater than the i-region bandgap 22 will excite the i-region 16.

Light energy that has passed to the i-region 16 which does not have sufficient energy to excite carriers in the i-region 22 may pass through to the smaller bandgap n-type region 14. This light energy may be greater than the n-type bandgap 23 and may be sufficient to excite carriers in the n-type region 14. With some excitation in the p-type 12 and n-type regions 14, it would be expected that a diffusion current would be created. In conventional photodiodes the photoexcited carriers (electron-hole pairs) contribute to the conduction by diffusing into the active i-region 16 and sweeping across the i-region.

However, in the new photodiode, the photoexcited carriers from the p-type 12 and n-type regions 14 are effectively blocked from entering the active i-region 16 by the band offset at the p-type heterojunction 25 and the n-type heterojunction 24. The band offsets 24,25 are the difference between the bandgap of the active i-region and the lower bandgap at the p and n-type regions. The electron-hole pairs do not have sufficient energy to step up to the larger bandgap active region and will be unable to cross the heterojunctions. Eventually, the majority of the photoexcited electrons and holes will recombine in their respective regions and will not contribute to the photocurrent of the photodiode 10. In structures where only one of the p or n-type regions have a smaller bandgap, a band offset will exist between the smaller bandgap region and the active region, also reducing diffusion current.

The bandgap offset at the p and n-type heterojunctions 24,25 also enhances wavelength cutoff and response time. To be truly solar blind, the photodiode 10 can only react to wavelength less than approximately 300 nm. It is desirable to have the reactivity of the photodiode cutoff sharply at the 300 nm wavelength. In conventional photodiodes, a diffusion current can degrade the wavelength cutoff, resulting in a sloping cutoff.

The present invention provides for more ideal wavelength cutoff. The bandgap offset at the heterojunction 24,25 provides a barrier to the electron-hole pairs generated in the p-type and/or n-type regions, reducing diffusion current. The primary source of current within the photodiode 10 will be the photoexcited carriers generated in the i-region 16, by light with sufficient energy to excite in the i-region 16. When the wavelength of light is longer than 300 nm, electron-hole pairs will not be generated in the i-region 16 and there will be little diffusion conduction from the p-type and/or n-type regions to degrade the cutoff.

Still another advantage of bandgap offset at the heterojunctions 24,25 is the enhanced signal response time of the photodiode 10. The current generated by diffusion of electron-hole pairs occurs more slowly in response to a signal when compared to the response of the active i-region 16. This slower diffusion current can slow the overall response of the photodiode 10. The bandgap offset at the heterojunctions 24,25 present an energy barrier that reduces the diffusion current. Thus, the reactivity of the device is primarily dependent upon the reactivity of the i-region 16 and is not impacted by a slower diffusion current. This enhanced response time makes the photodiode 10 particularly effective in responding to a pulse inputs. The device will respond to a pulse input with a similar pulse output. Anther unique characteristic of the new photodiode 10 is that the valence band energy for the p and n-type bandgaps 21 and 23 is higher than the valence band energy of the active i-region's bandgap 22.

Figure 3:
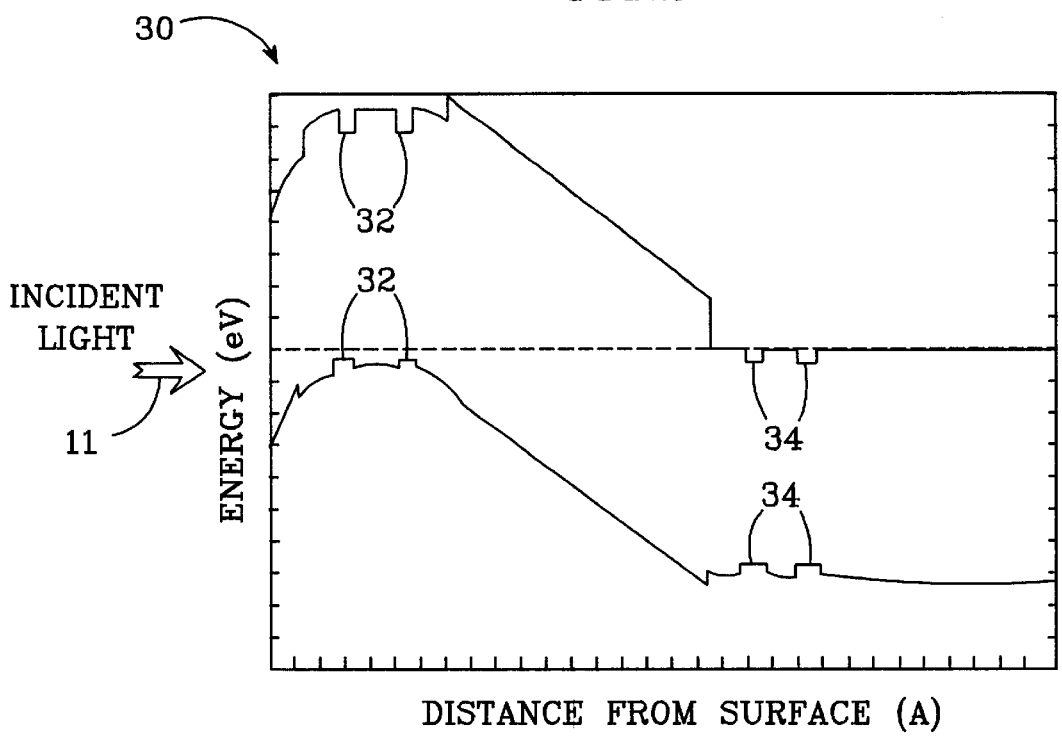
FIG. 3 is a band diagram of photodiode showing the addition of quantum wells near the heterojunctions.

The performance of the photodiode 10 could be further enhanced by the addition of single or multiple quantum wells in the narrower bandgap p-type 12 and n-type regions 14, near or at the heterojunction with the i-region 16 (e.g. within a carrier diffusion length). FIG. 3 shows a band diagram 30 of the photodiode with the quantum wells near the heterojunction of the p-type layer 32 and near the heterojunction of the n-type layer 34. The quantum wells 32,34 are layers within the p and n-type regions that have smaller bandgaps than their respective regions. The quantum wells act as trapping sites which help to prevent photoexcited carriers in the p-type 12 and n-type regions 14 from reaching the i-region 16. The photoexcited carriers can lower their energy by entering the wells and as such, are drawn to the wells. Once in the quantum wells, the electrons and holes can more easily recombine and will not adversely affect the performance of the photodiode 10. Although these regions of smaller bandgap are called "quantum wells" herein, the regions may be sufficiently thick that quantum effects are not expected. In general, the thickness of these layers may vary from 2 angstroms to greater that 1000 angstroms while still achieving an increase in recombination, although the utility of these layers increases with decreasing thickness.

Figure 4:
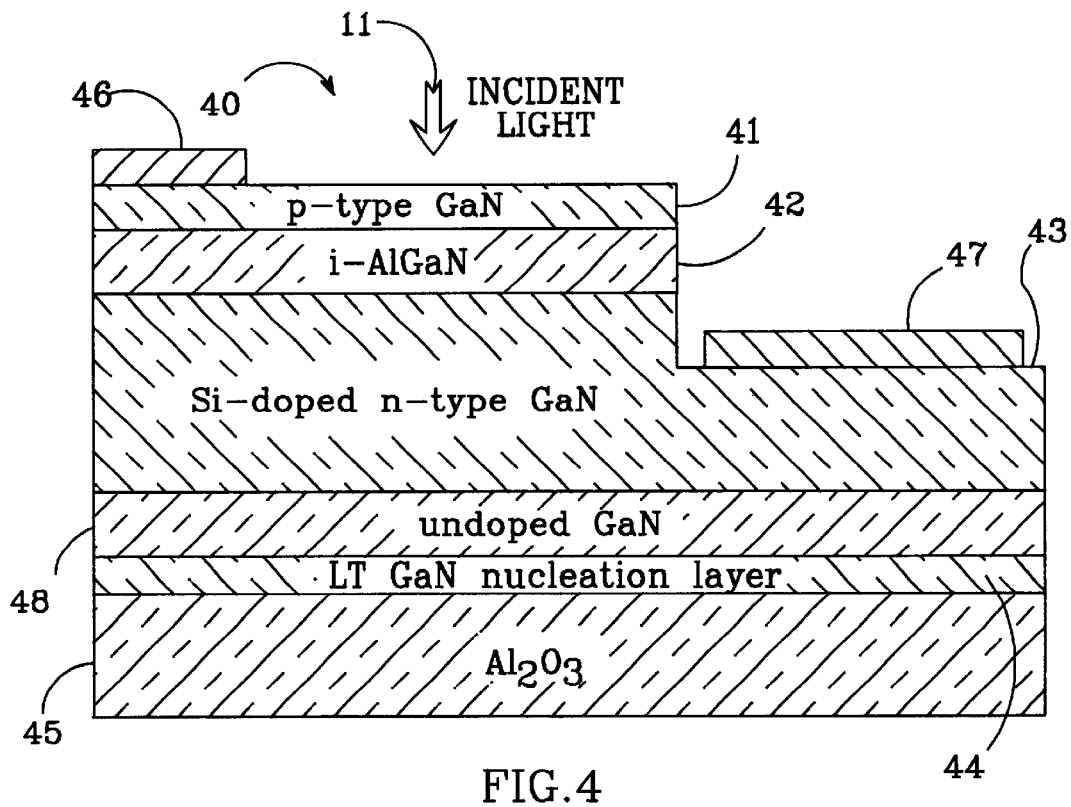
FIG. 4 is a sectional view of a second embodiment of the present invention.

FIG. 4 shows a layer structure for another preferred embodiment 40 of the invention. In this structure, the p-type region 41 is GaN, i-region 42 is AlGaN and the n-type region 43 is Si-doped GaN. As with photodiode 10, the i-region 16 has a larger bandgap than the p-type 12 and n-type region 14. The p-type 41 and n-type 43 regions may contain Al, but at lower concentration that the active AlGaN i-region 42. The regions have the same thickness ranges as the photodiode 10.

The photodiode 40 also contains a nucleation region 44 which can consist of GaN, AlGaN, AlN, or other nitride alloys, although GaN in the preferred material. The nucleation region 44 is typically included in the growth of nitride based photodiodes grown on sapphire substrates 35. LT refers to the lower temperature growth of this region. Growing GaN on a sapphire substrate at reactor temperature of approximately 1000° C. does not provide the desired coverage or adhesion between the materials. The growth of GaN on the substrate at the lower temperature of approximately 600° C. provides the desired coverage and adhesion but also results in a GaN material of reduced quality. Thus, the LT GaN 44 region cannot serve as an operating region of the diode. Good coverage and adhesion does result if a GaN material is grown at high reactor temperature on LT GaN. Accordingly, once the LT GaN nucleation region 34 is grown, GaN can then be grown at high reactor temperature directly on the LT GaN, providing high quality operating regions with good coverage and adhesion. The photodiode 40 can have an undoped GaN region 48 between the nucleation region 44 and the n-type region 43 to further enhance the quality of the GaN based operating regions. The typical thickness of the undoped region 48 is in the range of 5000 to 2 microns and the nucleation region 44 is approximately 200 angstroms thick.

The photodiode 40 also has a p-type region metal contact 46 and n-type region metal contact 47 that allow current to flow out of the device in the same manner as the electrical contacts in the photodiode 10. This embodiment may also be used with various types of materials and material compositions as described above.

Figure 5:
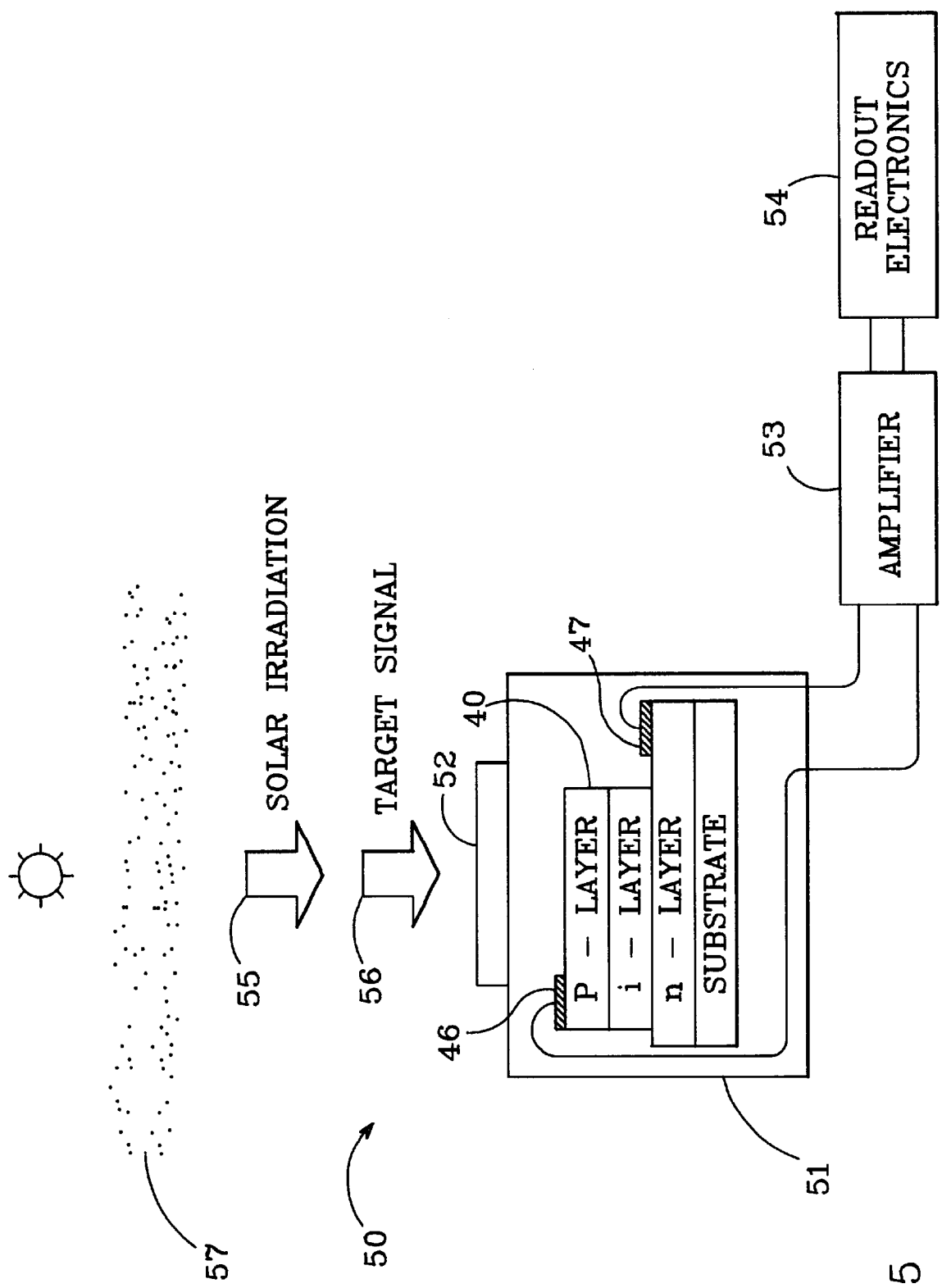
FIG. 5 is a block diagram of the photodiode of FIG. 4 incorporated into a true solar blind missile tracking system.

FIG. 5 is a simplified schematic showing the photodiode 40 incorporated in a solar blind missile tracking or detection system 50. A single photodiode 40 is shown, but the system 50 commonly uses numerous photodiodes in a photodiode array. The photodiode or photodiode array is mounted in a detector housing 53 which has a housing window 52 to allow light into the housing 51. The photodiode metal contacts 46,47 are connected to a transimpedence amplifier 53 that in turn is connected to a current readout 54. Solar irradiation 55 will have a wavelength greater than 300 nm, the shorter wavelength irradiation being filtered out by the earths ozone 57. Using the inventive photodiode 40, the irradiation from the sun will not be detected. However, the irradiation from the target signal 56 with a wavelength less than 300 nm will be detected by photodiode 40 and will generate a current that will be indicated at the current readout 54. The system 50 can detect (and track) the light from a target signal 56 while at the same time rejecting the background solar irradiation 55.

Figure 6:
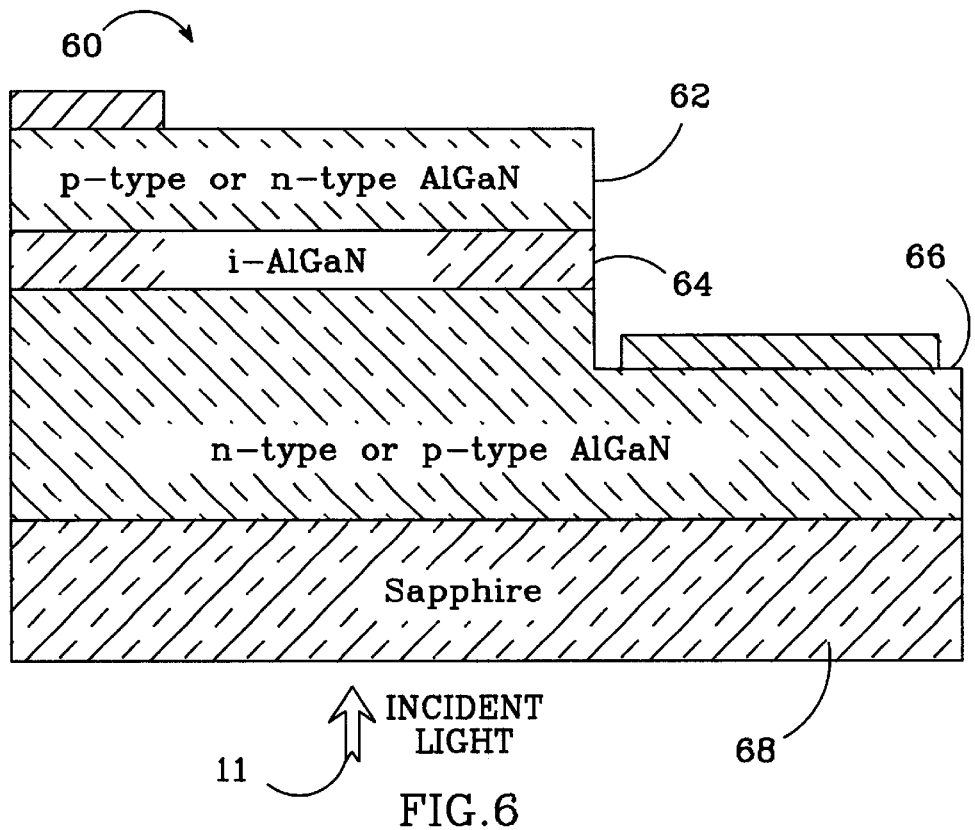
FIG. 6 is a sectional view of a backside illumination embodiment of the invention.

The invention may also be utilized in the fabrication of backside illuminated photodiodes, particularly in the (Al, Ga,In)N system. Backside illuminated photodiodes are particularly useful in photodiode arrays. FIG. 6 shows a layer diagram for a preferred embodiment of the inventive backside illuminated photodiode 60. The top region 62 and the bottom region 66 can be either p or n-type, the bottom region 66 being n-type if the top region 62 is p-type and vice versa. In the preferred embodiment, the top region 62 is p-type and the bottom region 66 is n-type. The backside photodiode 60 also has an i-region 64 and the entire structure is deposited on a sapphire substrate 68.

In operation of the backside illuminated photodiode 60, the light incident 61 illuminates the bottom region 66, which is n-type. It is easier to grow high Al content n-type GaN compared to high Al content p-type GaN. Accordingly, the n-type bottom region 66 can be grown with a larger bandgap than the active region, allowing light to pass through the bottom region 66 to the active region 64 without being absorbed. Alternatively, the n-type bottom region 66 can be have a smaller bandgap and grown thin. As a third alternative, the bottom region 66 can be p-type with a bandgap smaller than the i-region 64. The p-type bottom region 66 will be grown thin, to approximately 300 angstroms. A small portion of the light incident on the bottom region 66 will excite and be absorbed, but the majority of the light will pass to the i-region 64.

The photodiode 60 also contains electrical contacts 68,69 which function in the same manner as photodiodes 10,40. Just as with the above embodiments 10,40 this embodiment may also be used with various types of materials and material compositions.

The described embodiments of the invention 10,40,50,60 may also be operated under bias or in avalanche photodiode mode. In avalanche mode, a large reverse bias is applied to the device through the respective electrical contacts, which is applied across the active layer. For sufficient biases, an electron-hole pair created in the active region will achieve sufficient energy (accelerated by the field produced by the bias) to "knock" other electrons out of the valence band into the conduction band. These additional carriers are then accelerated by the same field to "knock" other electrons out of their bonding sites. The process is repeated, resulting in an avalanche effect. A large number of free electrons are generated from just one electron-hole pair, thereby greatly increasing the sensitivity of the device. The wide bandgap active region may be placed adjacent to a narrower bandgap "multiplication" region, thereby enabling a separate absorption and multiplication (SAM) avalanche photodiode.

Although the present invention has been described in considerable detail with reference to certain preferred configurations thereof, other versions are possible. Therefore, the spirit and scope of the appended claims should not be limited to their preferred versions contained therein.

We claim:

1. A solar blind, surface incident inverted heterojunction p-i-n photodiode, comprising:

a p-type region;

an n-type region; and an active i-region between said p-type and n-type regions, each said region having a respective bandgap, said i-region having a larger bandgap than one or both of said p-type and n-type regions, said i-region's bandgap large enough to be responsive to wavelengths of light shorter than approximately 300 nm, said p- and/or n-type regions capable of receiving the light incident on said photodiode, said p- or n-type receiving layer being thin enough to transmit the majority of the incident light to said active i-region.

2. The photodiode of claim 1, wherein said i-region is undoped or lightly doped to a level less than one or both of said p-type and n-type regions.

3. The photodiode of claim 1, wherein said active i-region has a bandgap that is at least 10% larger than the bandgap of said p-type and/or n-type region.

4. The photodiode of claim 1, comprised of a Group III-V or Group II-VI semiconductor material.

5. The photodiode of claim 1, comprised of $Al_xIn_yGa_{1-x-y}N$ such that $0 \leq x \leq 1$, $0 \leq y \leq 1$, $x+y \leq 1$ with the composition of said p-type region, n-type region and i-regions tailored to achieve the desired respective bandgaps.

6. The photodiode of claim 1, wherein said photodiode is comprised of GaN, with Al added to said active i-region to achieve the desired bandgap.

7. The photodiode of claim 6, wherein Al is added to said active i-region such that said photodiode is responsive to a wavelength of light shorter than approximately 300 nm.

8. The photodiode of claim 7, wherein said active i-region is approximately 30% Al.

9. The photodiode of claim 6, wherein said p-type region and n-type regions are comprised of AlGaN.

10. The photodiode of claim 1, wherein said i-region contains both In and Al such that said photodiode is responsive to a wavelength of light shorter than approximately 300 nm.

11. The photodiode of claim 10, wherein each said region has a lattice parameter, the composition of each said region is such that said lattice parameters of said regions are closely matched.

12. The photodiode of claim 10, wherein said i-region is approximately 35% Al and 10% In.

13. The photodiode of claim 1, wherein said p-type region is approximately 10 angstroms to 1 micron thick, said active i-region is approximately 50 angstroms to 5 microns thick and said n-type region is approximately 50 angstroms to 5 microns thick.

14. The photodiode of claim 1, wherein said p-type region is capable of receiving light and transmitting the majority of said light to said i-region, said p-type region being approximately 300 angstroms thick.

15. The photodiode of claim 1, further comprising metal contacts on said p-type region and on said n-type region respectively.

16. The photodiode of claim 1, operating in avalanche mode wherein a reverse bias is applied across said photodiode through said metal contacts.

17. The photodiode of claim 1, wherein each of said regions has a valence band energy, said p- and/or n-type regions having a valence band energy that is higher than the valence band energy of said active i-region.

18. The system of claim 1, wherein each of said regions has a valence band energy, said p- and/or n-type regions having a valence band energy that is higher than the valence band energy of said active i-region.

19. The photodiode of claim 1, further comprising quantum wells within said p- and/or n-type regions, said quantum wells having a smaller bandgap than their respective regions.

20. An inverted heterojunction p-i-n photodiode, comprising:
 a p-type region;
 an n-type region;
 an active i-region between said p-type an n-type regions, each said region having a respective bandgap, said i-region having a larger bandgap than one or both of said p-type and n-type regions;
 a nucleation region adjacent to said n-type region; and
 a substrate adjacent to said nucleation region.

21. The photodiode of claim 20, wherein said i-region is undoped or lightly doped to a level less than one or both of said p-type and n-type regions.

22. The photodiode of claim 20, further comprising an undoped region between said n-type region and said nucleation region.

23. The photodiode of claim 22, wherein said p-type region is approximately 10–500 angstroms thick, said active i-region is approximately 50–5000 angstroms thick, said n-type region is approximately 5000 angstroms to 5 microns thick, said undoped region is approximately 5000 angstroms to 2 microns thick, and said nucleation region is approximately 200 angstroms thick.

24. The photodiode of claim 20, wherein said p-type region is GaN, said i-region is AlGaN, said n-type region is Si doped GaN, and said undoped region is undoped GaN.

25. The photodiode of claim 20, wherein said nucleation region is comprised of GaN deposited on said substrate at a temperature lower than the temperature for growing said p-type region, i-region and n-type region.

26. The photodiode of claim 20, wherein said p-type region is capable of receiving light and transmitting the majority of said light to said i-region, said p-type region being approximately 300 angstroms thick.

27. The photodiode of claim 20, wherein Al is added to said active i-region such that said photodiode is responsive to a wavelength of light smaller than approximately 300 nm.

28. The photodiode of claim 20, wherein said active i-region is approximately 30% Al.

29. The photodiode of claim 20, wherein said i-region contains both In and Al such that said photodiode is responsive to a wavelength of light shorter than approximately 300 nm.

30. The photodiode of claim 29, wherein each said region has a lattice parameter, the composition of each said region is such that said lattice parameters of said regions are closely matched.

31. The photodiode of claim 29, wherein said i-region is approximately 35% Al and 10% In.

32. The photodiode of claim 20, wherein said active i-region has a bandgap at least 10% larger than the bandgap of said p-type region and/or n-type region.

33. The photodiode of claim 20, wherein said substrate is sapphire.

34. The photodiode of claim 20, further comprising metal contacts on said p-type region and on said n-type region respectively.

35. The photodiode of claim 34, operating in avalanche mode wherein a reverse bias is applied across said photodiode through said metal contacts.

36. The photodiode of claim 20, comprised of a Group III-V or Group II-VI semiconductor material.

37. The photodiode of claim 20, comprised of $Al_xIn_yGa_{1-x-y}N$ such that $0 \leq x \leq 1$, $0 \leq y \leq 1$, $x+y \leq 1$ with the composition of said p-type, n-type region and i-regions tailored to achieve the desired respective bandgaps.

38. A backside illuminated inverted heterojunction p-i-n photodiode, comprising:
   a sapphire substrate;
   a first region adjacent to said substrate, said first region being either p-type or n-type;
   a second region adjacent to said first region, said second region being an active i-region; and
   a third region adjacent to said second region, said third region being p-type when said first region is n-type, or said third region being n-type when said first region is p-type, said i-region having a larger bandgap then one or both of said first and third regions.

39. The photodiode of claim 38, wherein said i-region is undoped or lightly doped to a level less than one or both of said first and third regions.

40. The photodiode of claim 38, wherein said i-region has a bandgap at least 10% larger than the bandgap of said first region and/or third region having a smaller bandgap.

41. The photodiode of claim 38, wherein said first region is capable of receiving light through said substrate and transmitting the majority of said light to said i-region.

42. The photodiode of claim 41, wherein said first region is p-type with a bandgap smaller than said i-region.

43. The photodiode of claim 42, wherein said p-type region is approximately 10 angstroms to 1 micron thick.

44. The photodiode of claim 41, wherein said first region is n-type with a smaller bandgap than said i-region.

45. The photodiode of claim 44, wherein said n-type region is approximately 50 angstroms to 5 microns thick.

46. The photodiode of claim 38, wherein said first region is n-type having a larger bandgap than said i-region.

47. The photodiode of claim 46, wherein said n-type region is approximately 50 angstroms to 5 microns thick.

48. The photodiode of claim 38, wherein said regions are comprised of AlGaN, said i-region having a percentage of aluminum to be responsive to light with a wavelength smaller than approximately 300 nm, one or both of said first and third region having a bandgap at least 10% smaller than the bandgap of said i-region.

49. The photodiode of claim 38, further comprising metal contacts on said first region and on said third region respectively.

50. The photodiode of claim 49, operating in avalanche mode having a reverse bias applied across said photodiode through said metal contacts.

51. The photodiode of claim 38, comprised of a Group III-V or Group II-VI semiconductor material.

52. The photodiode of claim 38, comprised of $Al_xIn_yGa_{1-x-y}N$ such that $0 \leq x \leq 1$, $0 \leq y \leq 1$, $x+y \leq 1$ with the composition of said p-type region, said n-type region and said i-region tailored to achieve the desired respective bandgaps.

53. A solar blind missile tracking system and/or missile detection system, comprising:
   one or more inverted heterostructure p-i-n photodiodes wherein said photodiodes have i-regions with bandgaps larger than one or both of the n-type and p-type bandgaps, said i-regions bandgaps large enough to be responsive to wavelengths of light shorter than approximately 300 nm said p- and/or n-type regions capable of receiving the light incident on said photodiode, said p- or n-type receiving layer being thin enough to transmit the majority of the incident light to said active i-region;
   two metal contacts on each said photodiode respectively, one of said metal contacts on said p-type region and the other of said metal contacts on said n-type region; and
   a current readout connected to said photodiodes, said readout displaying the current generated by said photodiodes in response to a light source.

54. The system of claim 53, further comprising an amplifier connected between said photodiodes and said current readout.

55. The system of claim 53, wherein said photodiodes are formed on a sapphire substrate.

56. The system of claim 53, wherein said photodiodes have active i-regions with bandgaps that are at least 10% larger than the bandgaps of said p-type and n-type regions.

57. The system of claim 53, wherein said photodiodes are comprised of a Group III-V or Group II-VI semiconductor material.

58. The system of claim 53, comprised of $Al_xIn_yGa_{1-x-y}N$ such that $0 \leq x \leq 1$, $0 \leq y \leq 1$, $x+y \leq 1$ with the composition of said p-type region, n-type region and i-regions tailored to achieve the desired respective bandgaps.

59. The system of claim 53, wherein said photodiodes are comprised of GaN, with approximately 30% Al added to said active i-regions.

60. The system of claim 59, wherein said photodiodes have p-type regions and n-type regions comprised of AlGaN.

61. The system of claim 53, wherein said photodiodes have p-type regions that are approximately 10 angstroms to 1 micron thick, i-regions that are approximately 50 angstroms to 5 microns thick and n-type regions that are approximately 50 angstroms to 5 microns thick, respectively.

62. The system of claim 53, wherein said p-type region is capable of receiving light and transmitting the majority of said light to said i-region, said p-type region being approximately 300 angstroms thick.

63. The system of claim 53, further comprising quantum wells within said p- and/or n-type regions, said quantum wells having a smaller bandgap than their respective regions.

* * * * *